United States Patent
Choi et al.

(10) Patent No.: US 8,427,047 B2
(45) Date of Patent: Apr. 23, 2013

(54) ORGANIC LIGHT EMITTING DEVICE

(75) Inventors: Beohm-Rock Choi, Seoul (KR);
Un-Cheol Sung, Anyang-si (KR);
Jung-Soo Rhee, Seoul (KR); Sang-Woo Lee, Hwaseong-si (KR); Soo-Yeon Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 148 days.

(21) Appl. No.: 12/360,755

(22) Filed: Jan. 27, 2009

(65) Prior Publication Data

US 2009/0261716 A1    Oct. 22, 2009

(30) Foreign Application Priority Data

Apr. 16, 2008    (KR) .................. 10-2008-0035321

(51) Int. Cl.
*H01J 1/62*    (2006.01)

(52) U.S. Cl.
USPC .......................................... 313/504; 313/506

(58) Field of Classification Search .......... 313/459–512; 315/169.3, 169.4; 257/40, 79; 428/690, 428/917; 345/30, 36, 44, 45; 252/72, 181.1, 252/194
See application file for complete search history.

(56) References Cited

U.S. PATENT DOCUMENTS

| | | | |
|---|---|---|---|
| 5,559,400 A * | 9/1996 | Nakayama et al. | 313/506 |
| 2005/0040756 A1* | 2/2005 | Winters et al. | 313/504 |
| 2005/0225232 A1* | 10/2005 | Boroson et al. | 313/504 |
| 2005/0236982 A1* | 10/2005 | Nakayama et al. | 313/506 |
| 2005/0280364 A1* | 12/2005 | Omura et al. | 313/506 |
| 2006/0197458 A1* | 9/2006 | Winters et al. | 315/169.1 |
| 2007/0015429 A1* | 1/2007 | Maeda et al. | 445/24 |
| 2007/0075305 A1* | 4/2007 | Miyata et al. | 257/13 |
| 2007/0273279 A1* | 11/2007 | Kobayashi | 313/507 |
| 2008/0218070 A1* | 9/2008 | Kobayashi | 313/506 |
| 2009/0213568 A1* | 8/2009 | Karman et al. | 362/97.1 |

* cited by examiner

*Primary Examiner* — Anh Mai
*Assistant Examiner* — Elmito Breval
(74) *Attorney, Agent, or Firm* — Innovation Counsel LLP

(57) ABSTRACT

The present invention relates to an organic light emitting device including a first pixel, a second pixel, and a third pixel each displaying a color. Each pixel includes a reflecting member; a transflective member forming a micro-cavity along with the reflecting member; an organic light emitting member disposed between the reflecting member and the transflective member; a transparent electrode disposed between the reflecting member and the transflective member; and a compensation layer disposed between the reflecting member and the transflective member to form a predetermined distance between the reflecting member and the transflective member, wherein the distance between the reflecting member and the transflective member are substantially the same in the first pixel, the second pixel and the third pixel.

14 Claims, 7 Drawing Sheets

ORGANIC LIGHT EMITTING DEVICE

CROSS-REFERENCE TO RELATED APPLICATION

This application claims benefit of priority to Korean Patent Application No. 10-2008-0035321 filed in the Korean Intellectual Property Office on Apr. 16, 2008, the entire content of which is incorporated herein by reference.

BACKGROUND OF THE INVENTION (a) Field of the Invention

The present invention relates to an organic light emitting device.

(b) Description of the Related Art

Generally, an active matrix flat panel display includes a plurality of pixels for displaying images, and displays images by controlling the luminance of each pixel according to given information. One type of active matrix flat panel display device, an organic light emitting display, is a self-emissive display device having low power consumption, wide viewing angle, and high response speed. Therefore, organic light emitting display is being spotlighted as a dominant next-generation display device, possibly even more than liquid crystal display (LCD).

An organic light emitting device includes an organic light emitting element, which includes two electrodes with an emission layer disposed therebetween. Electrons injected from one of the electrodes and holes injected from the other electrode are combined in the light emitting layer to form excitons, and the excitons release energy and cause light to be emitted.

An organic light emitting device also includes a plurality of pixels such as a red pixel, a blue pixel, and a green pixel which, when combined, can display full-color images.

However, an organic light emitting device may have different light emitting efficiency depending on the light emitting material. That is, a material having low light emitting efficiency among red, green, and blue cannot represent the colors of a desired color coordinate. The material having low light emitting efficiency also makes it difficult to display a desired white color that is produced by combining red, green, and blue.

To improve light emitting efficiency of the light emitting material, a micro-cavity may be used. In a micro-cavity, light is repeatedly reflected between a reflection layer and a transflective layer that are separated by a predetermined distance (an optical path length) such that light of a specific wavelength is strengthened through constructive interference, while light of the remaining wavelengths is diminished through destructive interference. Accordingly, the luminance and the color reproducibility may be simultaneously improved at the display side. However, to represent full-color images using micro-cavities, the red pixel, green pixel, and blue pixel use optical path lengths corresponding to the wavelengths of each pixel. Forming the micro-cavities having different optical path lengths for each pixel requires multiple processes, causing the manufacturing processes of the organic light emitting device to be complicated.

The above information disclosed in this Background section is only for enhancement of understanding of the background of the invention and therefore may contain information that does not form the prior art that is already known in this country to a person of ordinary skill in the art.

SUMMARY OF THE INVENTION

An organic light emitting device according to an exemplary embodiment of the present invention includes a first pixel, a second pixel, and a third pixel for displaying different colors. The organic light emitting device includes a reflecting member, a transflective member forming a micro-cavity along with the reflecting member, an organic light emitting member disposed between the reflecting member and the transflective member, a transparent electrode disposed between the reflecting member and the transflective member, and a compensation layer disposed between the reflecting member and the transflective member to form a predetermined distance between the reflecting member and the transflective member, wherein the distance between the reflecting member and the transflective member is substantially the same in the first pixel, the second pixel, and the third pixel.

The compensation layer may be entirely disposed in the first pixel, the second pixel, and the third pixel, and be not separated and made of one layer.

The distance between the reflecting member and the transflective member may be in the range of 700 nm to 1100 nm.

The thickness of the transparent electrode may be substantially the same in the first pixel, the second pixel, and the third pixel.

The thickness of the compensation layer may be in the range of 300 nm to 999 nm.

The compensation layer may include an organic layer, an inorganic layer, or a combination of an organic layer and an inorganic layer.

The compensation layer may include a material selected from a group consisting of silicon nitride, silicon oxide, and combinations thereof.

The transparent electrode may include ITO or IZO.

The transflective member may include silver (Ag) or aluminum (Al), and the thickness of the transflective member may be in the range of 1 nm to 50 nm.

The organic light emitting device may further include a substrate, a thin film transistor formed on the substrate, and a color filter disposed between the thin film transistor and the transflective member, and the compensation layer, the transparent electrode, the organic light emitting member, and the reflecting member may be sequentially deposited on the transflective member.

The organic light emitting device may further include a first insulating layer formed between the thin film transistor and the color filter, and a second insulating layer formed between the color filter and the transflective member.

The organic light emitting device may further include a substrate, a thin film transistor formed on the substrate, and a color filter disposed on the thin film transistor, and the transflective member, the transparent electrode, and the reflecting member may be sequentially disposed between the thin film transistor and the color filter.

The organic light emitting device may further include an insulating layer formed between the thin film transistor and the reflecting member.

The first pixel may be a red pixel, the second pixel may be a blue pixel, and the third pixel may be a green pixel.

The organic light emitting device may further include a white pixel, and the transflective member may not be present in the white pixel.

The organic light emitting member may include a plurality of sub-emission layers emitting light of different wavelengths and emits a white light by combining the light of different wavelengths.

The organic light emitting member may include an emission layer emitting a red light, a green light, a blue light, or a white light.

DETAILED DESCRIPTION OF THE EMBODIMENTS

Figure 1:
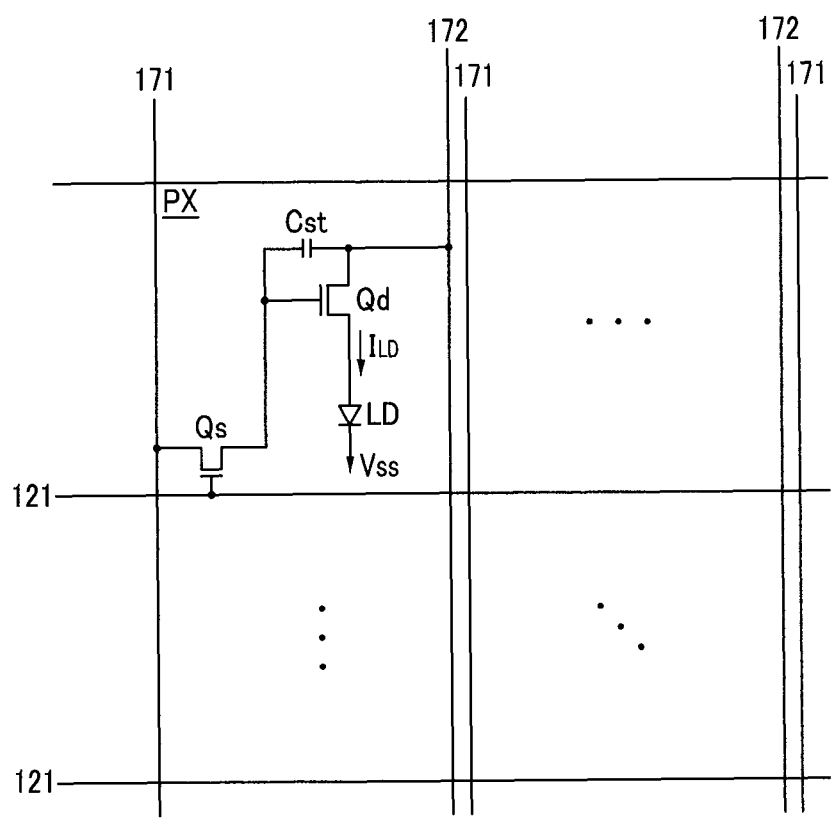
FIG. 1 is an equivalent circuit diagram of an organic light emitting device according to an exemplary embodiment.

The present invention will be described more fully hereinafter with reference to the accompanying drawings, in which exemplary embodiments of the invention are shown. As those skilled in the art would recognize, the described embodiments may be modified in various ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an OLED according to an embodiment of the present invention will be described in detail with reference to FIG. 1.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of first signal lines 121 for transmitting gate signals (or scanning signals), a plurality of second signal lines 171 for transmitting data signals, and a plurality of third signal lines 172 for transmitting a driving voltage. The gate signal lines 121 extend substantially in a row direction and are substantially parallel to each other, and the data lines 171 and the driving voltage lines 172 extend substantially in a column direction and are substantially parallel to each other.

Each pixel PX includes a switching transistor Qs, a driving transistor Qd, a storage capacitor Cst, and an organic light emitting element. The organic light emitting element functions as an organic light emitting diode (OLED).

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element. The driving transistor Qd drives an output current $I_{LD}$ having a magnitude that depends on the voltage difference between the control terminal and the output terminal.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element has an anode connected to the output terminal of the driving transistor Qd and a cathode connected to a common voltage Vss. The organic light emitting element emits light having an intensity depending on the output current $I_{LD}$ of the driving transistor Qd, thereby displaying images.

The switching transistor Qs and the driving transistor Qd of the preferred embodiment are n-channel field effect transistors (FETs). However, at least one of the switching transistor Qs and the driving transistor Qd may be a p-channel FET or a thin film transistor comprising semiconductor with amorphous silicon. In addition, the connections among the transistors Qs and Qd, the capacitor Cst, and the organic light emitting diode LD may be modified.

Figure 2:
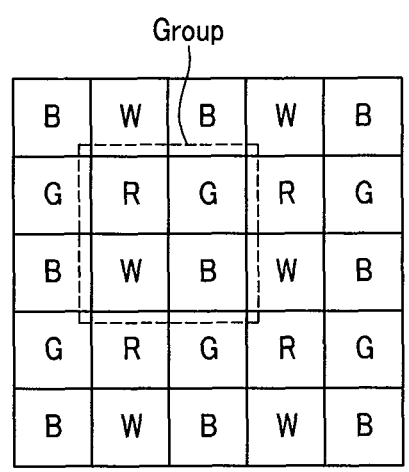
FIG. 2 is a schematic diagram showing an arrangement of a plurality of pixels in the organic light emitting device according to an exemplary embodiment.

FIG. 2 is a schematic diagram showing an arrangement of a plurality of pixels in the organic light emitting device according to an exemplary embodiment of the present invention. Referring to FIG. 2, the organic light emitting device according to an exemplary embodiment of the present invention includes red pixels R for displaying a red color, green pixels G for displaying a green color, blue pixels B for displaying a blue color, and white pixels W for displaying a white color, which are sequentially and alternately disposed. Four pixels of a red pixel R, a green pixel G, a blue pixel B, and a white pixel W may form one group, and may be repeatedly arranged according to rows and/or columns. However, the arrangement and the shape of the pixels may vary. The organic light emitting device may further include the white pixels W to improve the luminance as well as the red pixels R, the green pixels G, and the blue pixels B to display full colors. However, the white pixels W may be omitted.

Next, a detailed structure of an organic light emitting device according to an exemplary embodiment of the present invention will be described with reference to FIG. 3.

Figure 3:
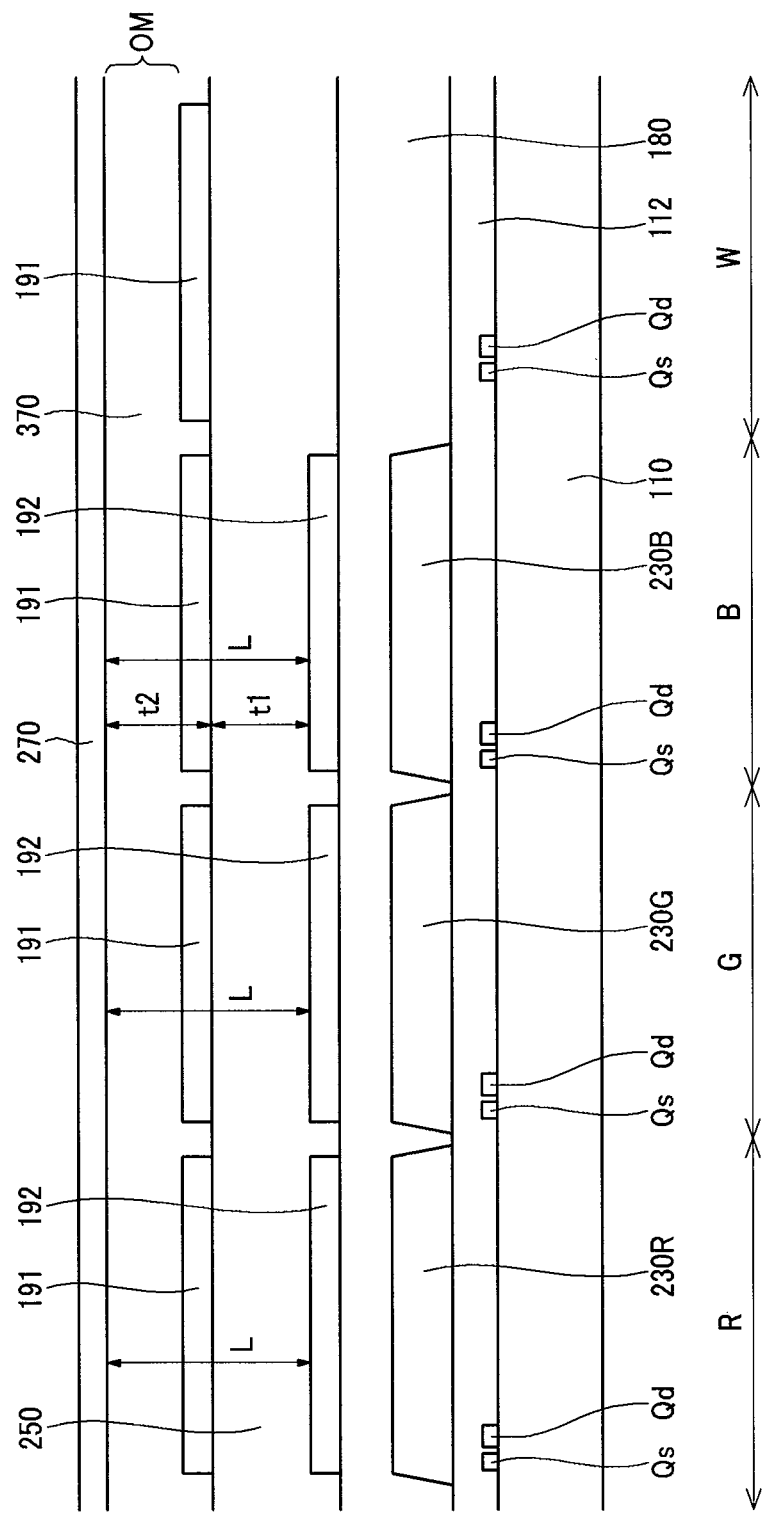
FIG. 3 is a cross-sectional view of an organic light emitting device according to an exemplary embodiment of the present invention.

FIG. 3 is a cross-sectional view of an organic light emitting device according to an exemplary embodiment of the present invention.

Referring to FIG. 3, a plurality of thin film transistor arrays are arranged on an insulating substrate 110. The thin film transistor arrays include switching thin film transistors Qs and driving thin film transistors Qd that are disposed and electrically connected in each pixel.

A lower insulating layer 112 is formed on the thin film transistor arrays Qs, Qd.

Red filters 230R, green filters 230G, and blue filters 230B are respectively formed in the red pixels R, green pixels G, and blue pixels B on the lower insulating layer 112. Transparent white color filters (not shown) may be formed in the white pixels W, although it is also possible for there to be no color filter formed in the white pixel area. The color filters 230R, 230G, and 230B may be disposed as a color filter on array (COA).

An upper insulating layer 180 is formed on the color filters 230R, 230G, and 230B, and a metal layer 192 is formed on the insulating layer 180.

In the present exemplary embodiment, the metal layer 192 as a transflective member is made of a material having characteristics such that a portion of light is transmitted and a portion of light is reflected. For example, the metal layer 192 may be formed of a conductor having a low absorption ratio such as aluminum (Al) or silver (Ag) with a thickness of about 1 nm to 50 nm. Alternatively, a plurality of layers that are made of inorganic materials having different refractive indexes and alternatively deposited may be used as the transflective member. The metal layer 192 is not present in the white pixels W.

A compensation layer 250 is formed on the metal layer 192 and the lower insulating layer 180. The compensation layer 250 is disposed in all pixels and may be formed in as one continuous layer. The compensation layer 250 may be an inorganic layer such as silicon nitride or silicon oxide, or alternately may be an organic layer. Furthermore, the compensation layer 250 may be a multi-layered structure including the organic layer and the inorganic layer. The thickness t1 of the compensation layer 250 may be in the range of from 300 nm to 999 nm. In the present exemplary embodiment, the thickness t1 of the compensation layer 250 is substantially equal to the distance between the surface of the metal layer 192 and the lower surface of the transparent electrode 191.

A plurality of transparent electrodes 191 are formed on the compensation layer 250, and the transparent electrodes 191 function as the anode electrode in each pixel. The transparent electrodes 191 may be made of a transparent conductor such as ITO or IZO.

An organic light emitting member (OM) is formed on the transparent electrodes 191. The sum value t2 of the thickness of the transparent electrode 191 and the thickness of the organic light emitting member (OM) formed thereon may be in the range of from 100 nm to 400 nm.

The organic light emitting member (OM) may include an auxiliary layer (not shown) for improving light emitting efficiency of a light emission layer 370 as well as the light emission layer 370 for emitting light.

The emission layer 370 may include a plurality of sequentially deposited sub-emission layers of materials emitting red, green, and blue light, and may emit white light by combining their wavelengths of light. Herein, the present invention is not limited to forming the sub-emission layers vertically, the sub-emission layers may also be formed horizontally. Also, the combination of light to emit the white light is not limited to red, green, and blue color light. The sub-emission layers may be formed with various color combinations that emit a white light.

On the other hand, the organic light emitting member (OM) may be disposed with a separated shape in each pixel, and may include an emission layer emitting a red light in the red pixel R, an emission layer emitting a green light in the green pixel G, and an emission layer emitting a blue light in the blue pixel B.

In addition, the auxiliary layer may include an electron transport layer (not shown) and a hole transport layer (not shown), and/or an electron injecting layer (not shown) and a hole injecting layer (not shown).

A common electrode 270 is formed on the organic light emitting member (OM). The common electrode 270 is preferably made of a material with a high reflectance, and functions as a cathode electrode. The common electrode 270 is formed to cover the whole surface of the substrate 110, and forms a pair with each transparent electrode 191 that functions as the anode electrode to conduct current through the organic light emitting member (OM).

In an exemplary embodiment of the present invention, the metal layer 192 generates a micro-cavity effect along with the common electrode 270. The micro-cavity effect occurs when light is repeatedly reflected between a reflection member and a transflective member, which are spaced from each other by a predetermined distance (hereinafter, "the length L of the light path") such that light of a predetermined wavelength is enhanced by constructive interference. Here, the common electrode 270 functions as the reflection member, and the metal layer 192 functions as a transflective member.

The common electrode 270 changes the light emitting characteristics of the light from the light emission layers 370, and light near a wavelength corresponding to the resonance wavelength of the micro-cavity among the changed light is enhanced through the constructive interference, while light of different wavelengths is suppressed by the destructive interference.

Here, the enhancement and the suppression of the predetermined wavelength may be determined according to the length L of the light path. The length L of the light path must satisfy the constructive interference condition for each wavelength of the red, green, and blue pixels.

The lengths L of the light path are all the same in the red pixel R, the blue pixel B, and the green pixel G in an exemplary embodiment of the present invention. The length L of the light path may be in the range of from 700 nm to 1100 nm. The length L of the light path may be controlled by the compensation layer 250 disposed between the metal layer 192 and the common electrode 270. When the length L of the light path has a specific value between from 700 nm to 1100 nm, each wavelength of the red, the green, and the blue pixels simultaneously satisfies the constructive interference condition.

Figure 7:
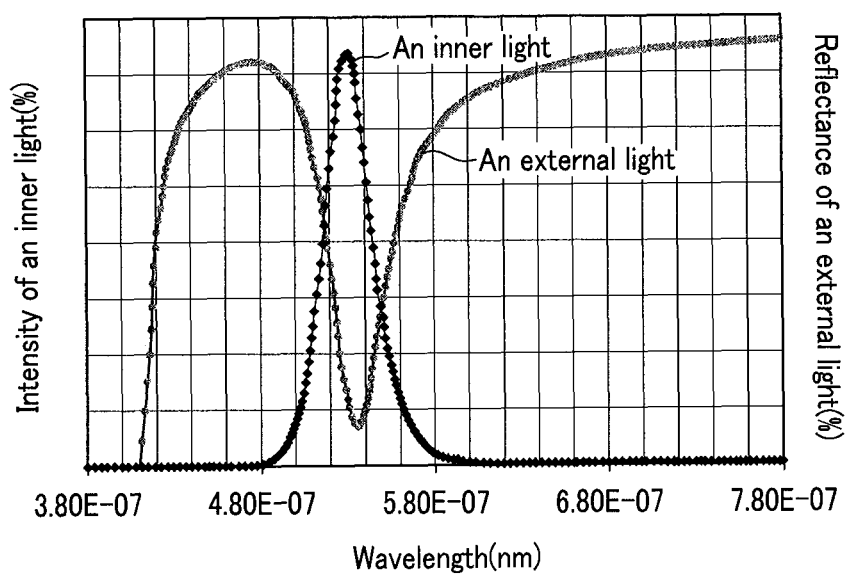
FIG. 7 is a graph showing the relation between intensity of an internal light of a specific wavelength and reflectance by an external light.

Referring to FIG. 7, when the radiance of the inner light of the specific wavelength using the micro-cavity effect is a maximum, the reflectance by the external light becomes a minimum. Here, the inner light means light generated in the emission layer 370, and the external light means a light incident from outside of the display device. Specifically, if the external light is incident in the red pixel R of the organic light emitting device, the lights of the green and blue wavelengths included in the external light are absorbed and the light of the red wavelength is retained. As a result, the inner light is enhanced in the red pixel R and the reflectance becomes minimum, thereby suppressing the reflection of the external light of the red wavelength. The same effects are generated in the green pixel G and blue pixel B.

Accordingly, according to the present exemplary embodiment, each wavelength of the inner light is enhanced by the micro-cavity effect such that the luminance may be increased, and the color reproducibility may be simultaneously increased. In addition, the reflection of the external light is suppressed such that the deterioration of the contrast ratio may be prevented.

Also, according to the present exemplary embodiment, the thicknesses of the transparent electrodes 191 are the same in the red pixel R, the green pixel G, and the blue pixel B such that it is not necessary that the process for forming the micro-cavity is executed for each pixel. That is, it is necessary that the transparent electrodes 191 are formed with the different thicknesses for forming the micro-cavity for each pixel such that the manufacturing process of the organic light emitting device may be simplified and the process time may be reduced.

Figure 5:
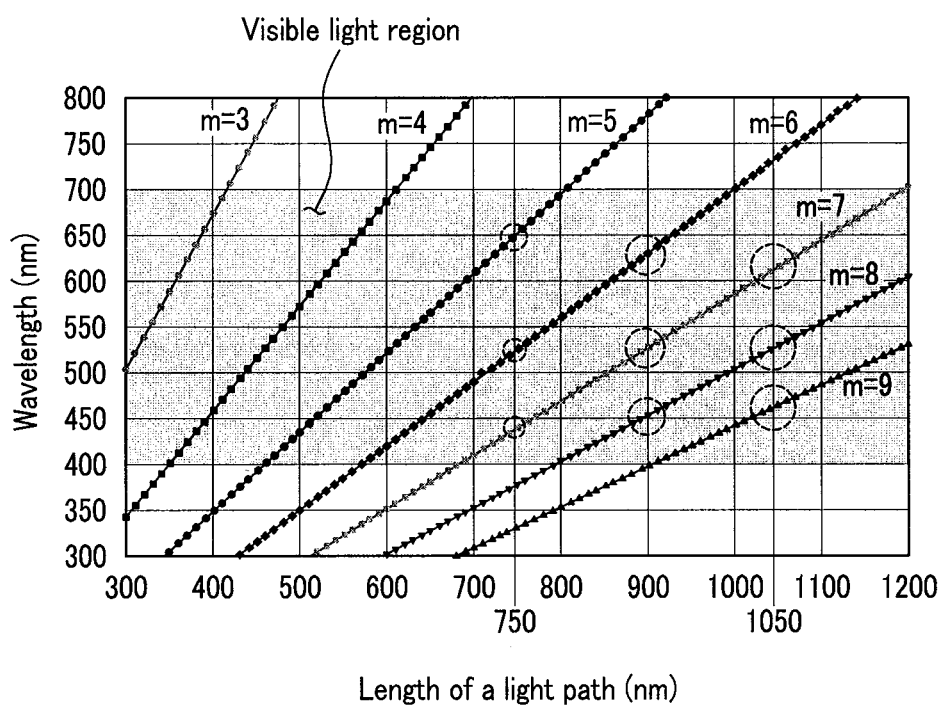
FIG. 5 and FIG. 6 are experiment graphs showing the satisfaction of a condition of a constructive interference for all wavelengths of a red pixel, a green pixel, and a blue pixel.
Figure 6:
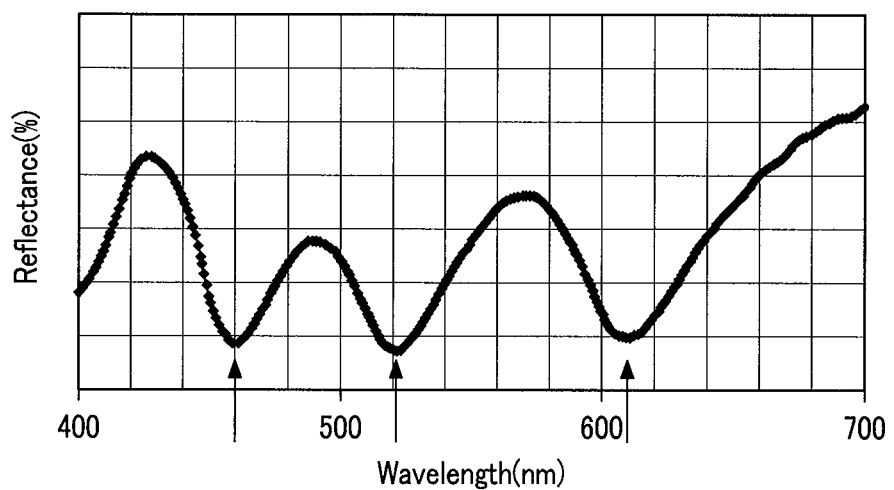

FIG. 5 and FIG. 6 are experiment graphs showing the satisfaction of the condition of a constructive interference for all wavelengths of a red pixel R, a green pixel G, and a blue pixel B. In the experiments, a transparent electrode 191 made of ITO or IZO, a reflection member and a transflective member made of silver or aluminum, and a compensation layer made of silicon nitride are used. The wavelength enhanced in the red pixel R, the green pixel G, and the blue pixel B may be represented as follows.

$$\lambda m = 4\pi n L/(\phi 1 + \phi 2 - 2\pi m)$$

Here, $\lambda$ is a wavelength, n is a refractive index average of an organic light emitting member (OM), a transparent electrode and a compensation layer, L is a length of a light path, $\phi$ is a phase shift value of the reflecting electrode, and m is an integer.

Referring to FIG. 5, the various resonance wavelengths appears in the length of the specific light path. Among these, there is the length region of the light path having three resonance wavelengths in the visible light region (400 nm to 700 nm). When the wavelength required for the display device is in the range of from 440 nm to 650 nm, the length of the light path that three resonance wavelengths may be simultaneously represented in this wavelength region become near 750 nm, 900 nm, and 1050 nm.

As described in the above experiments, if the length of the light path is increased, the condition that the wavelengths of the red, the green, and the blue are all enhanced in the thickness of the same elements may be obtained. In this organic light emitting device, if the reflectance of the external light is measured, as shown in FIG. 6, the reflectance of the external light has the minimum value at the arrows where each wavelength of red, green, and blue is enhanced.

Next, an organic light emitting device according to another exemplary embodiment of the present invention will be described with the reference to FIG. 4.

Figure 4:
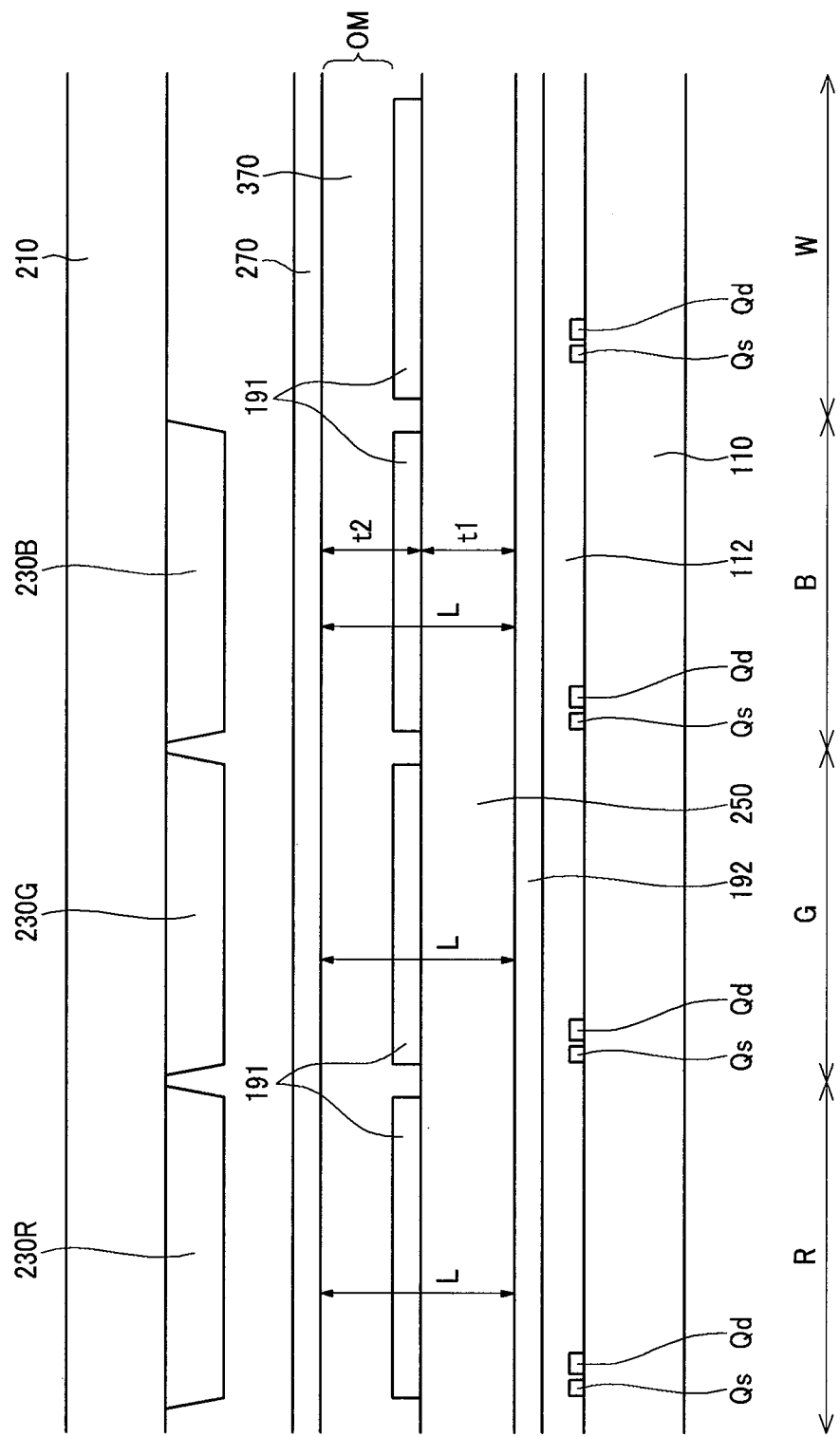
FIG. 4 is a cross-sectional view of an organic light emitting device according to another exemplary embodiment.

FIG. 4 is a cross-sectional view of an organic light emitting device according to another exemplary embodiment of the present invention.

Referring to FIG. 4, most of the constituent elements according to the present exemplary embodiment are the same as that of the exemplary embodiment shown in FIG. 3. However, the exemplary embodiment shown in FIG. 3 is an organic light emitting device of bottom-emission type, whereas the present exemplary embodiment is an organic light emitting device of top-emission type.

Again referring to FIG. 4, a plurality of thin film transistor arrays are arranged on an insulating substrate 110. The thin film transistor arrays include switching thin film transistors Qs and driving thin film transistors Qd that are disposed in each pixel and electrically coupled to each other.

A lower insulating layer 112 is formed on the thin film transistor arrays Qs and Qd.

A metal layer 192 is formed on the lower insulating layer 112. In the present exemplary embodiment, the metal layer 192 as a reflection member may be made of a metal having a high reflectance such as aluminum (Al) or silver (Ag).

A compensation layer 250 is formed on the metal layer 192. The compensation layer 250 may be made of an inorganic layer such as silicon nitride or silicon oxide, or alternatively may be made of an organic layer. Furthermore, the compensation layer 250 may have a multi-layered structure including the organic layer and the inorganic layer. The thickness t1 of the compensation layer 250 may be in the range of 300 nm to 999 nm.

A transparent electrode 191 is formed on the compensation layer 250, and the transparent electrode 191 functions as an anode electrode in each pixel. The transparent electrode 191 may be made of a transparent conductor such as ITO or IZO.

An organic light emitting member (OM) is formed on the transparent electrode 191. The sum value t2 of the thickness of the transparent electrode 191 and the thickness of the organic light emitting member (OM) may be in the range of 100 nm to 400 nm.

The organic light emitting member (OM) may include an auxiliary layer (not shown) for improving light emitting efficiency of a light emission layer 370 as well as the light emission layer 370 for emitting light.

The emission layer 370 may include a plurality of sequentially deposited sub-emission layers of materials emitting red, green, and blue light, and may emit white light by combining their wavelengths of light. Herein, the present invention is not limited to forming the sub-emission layers vertically, the sub-emission layers may also be formed horizontally. Also, the combination of light to emit the white light is not limited to red, green, and blue color light. The sub-emission layers may be formed with various color combinations that emit a white light.

The organic light emitting member (OM) may also be disposed with a separated shape in each pixel, and may include an emission layer emitting a red light in the red pixel R, an emission layer emitting a green light in the green pixel G, and an emission layer emitting a blue light in the blue pixel B.

In addition, the auxiliary layer may include an electron transport layer (not shown) and a hole transport layer (not shown), and/or an electron injecting layer (not shown) and a hole injecting layer (not shown).

A common electrode 270 is formed on the organic light emitting member (OM). The common electrode 270 functions as a transflective member 192 and is made of a material having characteristics such that a portion of light is transmitted and a portion of light is reflected. For example, the common electrode 270 may be formed of a conductor having a low absorption ratio such as aluminum (Al) or silver (Ag) with a thickness of from 1 nm to 50 nm. The common electrode 270 functions as a cathode electrode and is formed to cover the whole surface of the substrate 110, and forms a pair with each transparent electrode 191 to conduct the current through the organic light emitting member (OM).

A encapsulation substrate 210 is disposed on the common electrode 270. The encapsulation substrate 210 encapsulates the organic light emitting member (OM) and the common electrode 270 to prevent moisture and/or oxides from penetrating from the outside.

Red filters 230R, green filters 230G, and blue filters 230B are respectively formed in the red pixels R, green pixels G, and blue pixels B and on the encapsulation substrate 210. No color filter or transparent white color filters (not shown) may be formed in the white pixels W. The color filters 230R, 230G, and 230B face the common electrode 270.

Numerous advantages of the exemplary embodiment shown in FIG. 3 apply to the exemplary embodiment shown in FIG. 4.

According to the present exemplary embodiment, like the exemplary embodiment shown in FIG. 3, each wavelengths of the inner light are enhanced by the micro-cavity effect such that the luminance may be increased, and the color reproducibility may be simultaneously increased. In addition, the reflection of the external light is suppressed such that the deterioration of the contrast ratio may be prevented.

Also, according to the present exemplary embodiment, the thicknesses of the transparent electrodes 191 are substantially the same in the red pixel R, the green pixel G and the blue pixel B such that it is not necessary for the process for forming the micro-cavity to be executed for each pixel. The transparent electrodes 191 are formed with the different thicknesses for forming the micro-cavity for each pixel such that the manufacturing process of the organic light emitting device may be simplified and the process time may be reduced.

According to an exemplary embodiment of the present invention, the micro-cavity is used such that the color reproducibility and the luminance may be increased, and simultaneously a plurality of pixels for displaying the different colors may have the same length of the light paths. Accordingly, the manufacturing process of the organic light emitting device may be simplified and the process time may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
    a portion of a reflecting member;
    a portion of a transflective member forming a micro-cavity with the reflecting member, wherein both the transflective member and the reflecting member extend continuously from the first pixel to the second pixel;
    an organic light emitting member disposed between the reflecting member and the transflective member;
    a transparent electrode disposed between the reflecting member and the transflective member; and
    a compensation layer disposed between the reflecting member and the transflective member to form a predetermined interval between the reflecting member and the transflective member.

2. The organic light emitting device of claim 1, wherein the transflective member is not electrically connected to the thin film transistor.

3. The organic light emitting device of claim 1, further comprising:
    a first insulating layer disposed between the thin film transistor and the transflective member;
    a compensation layer disposed between the transflective member and the transparent electrode; and
    a color filter disposed on a second substrate opposite to the first substrate.

4. The organic light emitting device of claim 3, wherein the transflective member is not electrically connected to the thin film transistor.

5. The organic light emitting device of claim 3, wherein the compensation layer, the transparent electrode, the organic light emitting member, and the reflecting member are sequentially deposited on the transflective member.

6. The organic light emitting device of claim 5, wherein the transflective member is not electrically connected to the thin film transistor.

7. The organic light emitting device of claim 1, wherein the thickness of the compensation layer is in the range of 300 nm to 999 nm.

8. An organic light emitting device comprising:
    a first substrate;
    a transflective member formed on the first substrate;
    a reflecting member formed between the first substrate and the transflective member, and extend continuously from a first pixel to a second pixel;
    an organic light emitting member disposed between the reflecting member and the transflective member;
    a transparent electrode disposed between the reflecting member and the transflective member, and connected to a thin film transistor formed on the first substrate; and
    a color filter formed on a second substrate,
    wherein the transflective member is disposed between the thin film transistor and the color filter.

9. The organic light emitting device of claim 8, wherein the transflective member is not electrically connected to the thin film transistor.

10. The organic light emitting device of claim 8, further comprising:
    a first insulating layer disposed between the thin film transistor and the transflective member;
    a compensation layer disposed between the transflective member and the transparent electrode.

11. The organic light emitting device of claim 10, wherein the transflective member is not electrically connected to the thin film transistor.

12. The organic light emitting device of claim 10, wherein the compensation layer, the transparent electrode, the organic light emitting member, and the reflecting member are sequentially deposited on the transflective member.

13. The organic light emitting device of claim 12, wherein the transflective member is not electrically connected to the thin film transistor.

14. The organic light emitting device of claim 8, wherein the thickness of the compensation layer is in the range of 300 nm to 999 nm.

* * * * *